(12) United States Patent
Gulla et al.

(10) Patent No.: US 7,785,454 B2
(45) Date of Patent: Aug. 31, 2010

(54) GAS DIFFUSION ELECTRODES, MEMBRANE-ELECTRODE ASSEMBLIES AND METHOD FOR THE PRODUCTION THEREOF

(75) Inventors: Andrea F. Gulla, Malden, MA (US); Robert J. Allen, South Harwich, MA (US); Emory De Castro, Nahant, MA (US); Enrico Ramunni, S. Donato Milanese (IL)

(73) Assignee: BASF Fuel Cell GmbH, Frankfurt am Main (DE)

( * ) Notice: Subject to any disclaimer, the term of this patent is extended or adjusted under 35 U.S.C. 154(b) by 0 days.

(21) Appl. No.: 12/154,499

(22) Filed: May 23, 2008

(65) Prior Publication Data

US 2008/0311435 A1 Dec. 18, 2008

Related U.S. Application Data

(62) Division of application No. 11/070,958, filed on Mar. 3, 2005, now Pat. No. 7,419,546.

(60) Provisional application No. 60/580,739, filed on Jun. 18, 2004.

(51) Int. Cl.
*C25B 11/03* (2006.01)
*C25B 11/08* (2006.01)

(52) U.S. Cl. .......... 204/283; 204/284; 204/293; 204/252; 429/40; 429/44; 429/42; 429/46; 502/101; 427/115

(58) Field of Classification Search ........ 429/40, 429/44, 42, 46; 204/283, 284, 293; 502/101; 427/115

See application file for complete search history.

(56) References Cited

U.S. PATENT DOCUMENTS

| 4,293,396 | A | * | 10/1981 | Allen et al. | 205/533 |
| 6,165,636 | A | * | 12/2000 | Giallombardo et al. | 429/44 |
| 6,379,834 | B1 | * | 4/2002 | Giallombardo et al. | 429/44 |
| 2001/0041283 | A1 | * | 11/2001 | Hitomi | 429/42 |
| 2003/0022057 | A1 | * | 1/2003 | Iwasaki et al. | 429/46 |
| 2003/0228421 | A1 | * | 12/2003 | Higami et al. | 427/402 |
| 2004/0058123 | A1 | * | 3/2004 | Cooper et al. | 428/105 |

* cited by examiner

*Primary Examiner*—Bruce F Bell
(74) *Attorney, Agent, or Firm*—Charles A. Muserlian

(57) ABSTRACT

A gas diffusion electrode comprising an electrically conductive web, a non-catalyzed gas diffusion layer comprising at least one electroconductive filler and at least one binder, and a noble metal coating obtained by subjecting an electrically conductive web to a first ion beam having an energy not higher than 500 eV, then to a second beam having an energy of at least 500 eV, containing the ions of at least one noble metal.

8 Claims, 1 Drawing Sheet

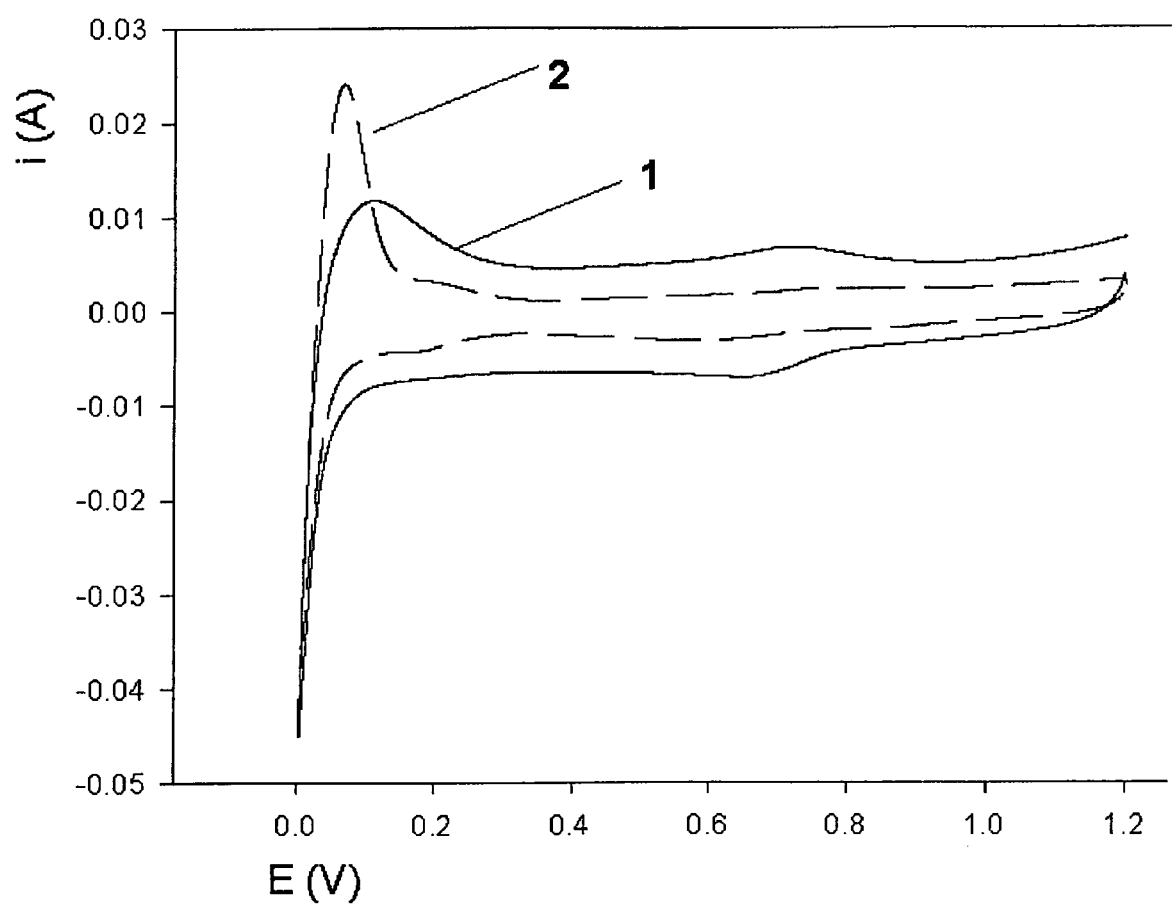

GAS DIFFUSION ELECTRODES, MEMBRANE-ELECTRODE ASSEMBLIES AND METHOD FOR THE PRODUCTION THEREOF

PRIOR APPLICATION

This application is a division of U.S. patent application Ser. No. 11/070,958 filed Mar. 3, 2005, now U.S. Pat. No. 7,419,546, which is based on Provisional Application Ser. No. 60,580,739 filed Jun. 18, 2004.

FIELD OF THE INVENTION

The invention is relative to gas diffusion electrodes for use in fuel cells and other electrochemical applications, and to the relevant method of production.

BACKGROUND OF THE INVENTION

Proton exchange membrane fuel cells (PEMFC) are considered to be one of the most promising sources of clean electrical energy for the near future. PEMFC are electrochemical generators which produce direct electrical current from a gaseous fuel (typically hydrogen, pure or in admixture) and a gaseous oxidant, normally consisting of oxygen or air. The core component of the cell is the membrane-electrode assembly, consisting of an ion-exchange membrane, which is the solid electrolyte supporting the whole process and the physical separator of the anode and cathode cell compartments, bonded or otherwise coupled to gas diffusion electrodes. The gas diffusion electrodes, one cathode and one anode, contacting either side of the ion-exchange membrane, usually comprise a gas diffusion medium and a catalyzed layer.

Several kinds of technical solutions are known from the prior art for these components: the catalyzed layers are in some cases applied to the gas diffusion media prior to coupling with the membrane, and/or they are directly coated on the membrane surface prior to the application of uncatalyzed gas diffusion media thereon. The gas diffusion medium usually comprises an electrically conductive web and one or more gas diffusion layers. The conductive web can be metallic or carbon-based, and may consist of a metal mesh, foam or cloth, of a woven or non-woven carbon cloth, of a carbon paper or of any other preferably porous or perforated medium. Gas diffusion layers are provided to supply suitable paths for the diffusion of gaseous reactants inside the electrode structure toward the catalytic sites whereupon the electrochemical reactions of fuel oxidation (anode side) and oxidant reduction (cathode side) occur. They are usually based on mixtures of electrically conductive inert fillers (for instance carbon particles) and suitable, preferably hydrophobic binders (for instance PTFE or other fluorinated binders).

Gas diffusion layers should be carefully designed to provide a permeable and smooth structure, to ensure a correct apportionment of the gaseous reactants without incurring heavy mass transport penalties, and to provide a good contact with the membrane. Improved gas diffusion structures for fuel cells are, for instance, disclosed in U.S. Pat. No. 6,103,077. A catalyzed layer can then be applied to the gas diffusion layers, for instance as described in U.S. Pat. No. 6,017,650; catalyzed layers of the prior art comprise noble metal catalysts such as platinum, optionally supported on carbon or graphite particles, a suitable binder, which can be the same hydrophobic binder already present in the gas diffusion layers, and an ionomeric component, usually an ionomeric perfluorocarbon species. The ionomeric component can be added to the catalyst-binder mixture and/or it can be applied subsequently as an external layer wetting the pre-applied catalyst and binder particles.

Gas diffusion electrodes of this kind, coupled to proton-exchange membranes known in the art, for instance based on fluorocarbon acids such as Nafion® (a trademark of U.S. company DuPont), give rise to membrane-electrode assemblies characterized by excellent performances. Nevertheless, the noble metal component is exploited to such a low extent in structures of this kind, that very high specific loadings are required (usually in the range of 0.3 to 1 mg/cm$^2$ of platinum both for the anode and for the cathode side in commercially available products). The high amount of noble metal required for obtaining suitable performances in fuel cells is perhaps the single most important factor preventing PEMFC (and other types of fuel cells such as DMFC, direct methanol fuel cells) from having a commercial success.

Direct metallization of ion-exchange membranes with a catalyst layer has been proposed as a means to achieve a better catalyst-membrane interface, allowing a better catalyst exploitation and therefore the use of lower noble metal loadings. However, no means for direct metallization of membranes has proven effective and practical up to now. High temperatures required by sputtering or ultra high vacuum deposition (UHV) are destined to impart consistent damages to the delicate ion-exchange membranes, and even the common physical and chemical vapor deposition techniques (PVD or CVD) have proven too difficult to control and cumbersome to scale up.

A substantial improvement in the metallization of membranes is disclosed in U.S. Pat. No. 6,077,621, wherein the use of dual IBAD is proposed for this purpose. Dual IBAD, which is an evolution of the Ion Beam Assisted Deposition (IBAD) technique, has the advantage of being a low temperature process and very easy to scale up. The membrane is initially cleaned and textured by a first low-energy ion beam, for instance an Ar$^+$ beam, having an energy not higher than 500 eV; a second beam is then focused on the membrane, containing higher energy ions (such as $O_2^+$ or $N_2^+$) together with the ions of the metals to be deposited, previously evaporated by means of an electron beam. Dual IBAD is much advantageous also over convention IBAD (in which a single beam is used), in that it allows the formation of a better controlled film with the required density and porosity while imparting a minimum stress to the membrane structure.

Since the handling of a large-sized, ion-exchange membrane in a continuous metallization process is not very easy, a further improvement of this technique has been disclosed in U.S. Pat. No. 6,673,127. In this case, a very thin ion-exchange membrane layer is formed on a gas diffusion structure, and then subjected to dual IBAD. Although this technique obtains high power densities in fuel cells with reduced platinum loadings, it still presents some disadvantages that the present invention wishes to address. Firstly, although the performances of these electrodes can be high, they can be somehow unpredictable since the reliability of this technique is affected by the characteristics of the ionomer film, which can vary according to the preparation conditions. The state-of-the-art liquid ionomer film is of fluorocarbonic nature, since this is the only known ionomeric material that would allow high power density operation, and it has to be recast from an alcoholic or hydroalcoholic suspension of a fluorocarbon acid such as the product commercialized as "Liquid Nafion" by DuPont.

The nature of these suspensions is not always consistent, since average molecular weight, morphological parameters of the suspended particles, rheological parameters and other factors may vary in a remarkable fashion from one batch to the other. Moreover, also in the best cases, the utilization factor of the catalyst with liquid ionomer-embedded particles never approaches unity. Liquid ionomers for gas diffusion electrodes were first described in U.S. Pat. No. 4,876,115 as a means for extending the proton conduction paths within the interstitial spaces of a three-dimensional catalytic layer, thereby improving the utilization factor of the catalyst (which is a measure of the availability and accessibility of the catalyst itself as a site for the desired reaction). This approach is effective up to a certain extent, only mimicking the ideal situation whereby all the catalyst is present in a very thin and smooth, quasi-two-dimensional layer, in direct contact with the membrane surface.

Besides solving the issue of lowering the platinum loading (or more generally the noble metal loading) in fuel cell electrodes, another problem which should be addressed is the low stability of fluorocarbon-based ionomeric components in membrane-electrode assemblies under certain process conditions. In some applications (such as automotive ones), fuel cells are operated in a discontinuous fashion depending on the instant power demand. Since PEMFC are known for their very quick start-up and their remarkable ability of following the requirements of steeply variable power demand, they are the most promising candidate for operating in this field. However, in conditions of zero or near-zero power demand, i.e. when little or no current is generated (open circuit voltage conditions), a consistent generation of peroxides on the anode side is likely to take place. Perfluorocarbon materials are often unstable under these conditions, especially over long times. Also for this reason, alternative membranes (for instance, based on polybenzimidizole, polyetherketones or polysulfones) have been developed for fuel cell applications. In any case, none of these materials have proven suitable for being employed as a proton conducting material for the electrode interface according to the teaching of U.S. Pat. No. 4,876,115, and perfluorocarbon materials such as the aforementioned "Liquid Nafion" are always used. The elimination of this component would therefore be beneficial for many reasons, not only of cost and reliability, but also of overall chemical stability at certain process conditions.

For all the above reasons, direct metallization of gas diffusion media was attempted with several different techniques in the past, with no major success. Although, for instance, U.S. Pat. No. 6,159,533 claims that excellent performances are obtainable with a PVD deposition of platinum on a gas diffusion medium, the examples show that the actual recorded performances don't go beyond a modest 732 mA/cm$^2$ at 0.358 V in a fuel cell provided with a very thin membrane (20 microns), fed with a very high gas flow-rate (3.5 stoichiometric ratio on air, 2 stoichiometric ratio on pure hydrogen) at a relatively high pressure (about 2 bar).

OBJECTS OF THE INVENTION

It is an object of the invention to provide a gas diffusion electrode overcoming the limitations of the prior art.

It is another object of the invention to provide a gas diffusion electrode obtained by direct metallization of a gas diffusion medium with low platinum loading and of high performances, preferably free of ionomeric fluorocarbon components, and a membrane-electrode assembly incorporating the same.

It is a further object of the invention to provide a method for forming a noble metal coating on a gas diffusion medium by direct metallization.

These and other objects and advantages of the invention will become obvious from the following detailed description.

THE INVENTION

Under a first aspect, the gas diffusion electrode of the invention consists of a gas diffusion medium, free of ionomeric components, provided with a noble metal coating by means of a dual IBAD deposition. The inventors have surprisingly found out that, contrary to other direct metallization techniques such as sputtering or PVD, dual IBAD is capable of forming thin and smooth noble metal coatings, in particular platinum coatings, with no damage to the underlying substrate and with excellent electrochemical characteristics. Even more surprisingly, the catalyst utilization factor (which is a measure of the catalytic effectiveness of the deposited noble metal coating) is not only much higher than in the electrodes of the prior art, but it is achieved without resorting to proton conducting materials in accordance with the teaching of U.S. Pat. No. 4,876,115.

More surprisingly, the inventors have found that the optional addition of suspensions of proton conducting materials in accordance with the teaching of U.S. Pat. No. 4,876,115 is, in most of the cases, detrimental for the performances. A characterization by voltammetry of the electrode of the invention coated with platinum in accordance with the invention showed that the addition of a 0.5 mg/cm$^2$ layer of Liquid Nafion decreases the Pt surface availability to a remarkable extent. The smoothness and density of the dual IBAD-applied noble metal coating is of great importance for obtaining a highly performing electrode. Especially in the case of platinum, the best results are obtained by employing a first low-energy beam of 100-500 eV, to clean and texture the surface of the gas diffusion medium, and a second high-energy beam, preferably of 500-2000 eV, of vaporized metal ions, to obtain a coating with a thickness preferably comprised between 5 and 500 nm and a loading preferably comprised between 0.01 and 0.1 mg/cm$^2$. In the present description, platinum is cited as an exemplary catalyst material for the gas diffusion electrode of the invention, but all other noble metals or combinations of different metals, noble and non-noble, can be used.

The nature of the gas diffusion medium is of utmost importance to obtain the required electrochemical performances with very low noble metal loadings. In a preferred embodiment, the gas diffusion medium whereto the noble metal coating of the invention is applied, is obtained on a conductive web, for instance a metal or carbon cloth or a carbon paper, previously coated with a gas diffusion layer comprising an electroconductive filler optionally consisting of carbon particles or fibers and a binder, preferably a hydrophobic, optionally fluorinated binder. The best results can be obtained making use of very smooth gas diffusion media, preferably of gas diffusion media with a smoothness higher than 1000 Gurley seconds, and most preferably, higher than 5000 Gurley seconds. Such high levels of smoothness are, for instance, obtainable by gravure-coating or other types of machine coating of inks of acetylene black carbon particles and PTFE or other equivalent fluorinated binders, optionally employing suitable smoothing additives as disclosed in a copending provisional patent application by the same applicant.

The gas diffusion electrode of the invention is particularly suited to be incorporated in a membrane-electrode assembly structure, preferably by binding to an ion-exchange membrane, optionally by hot pressing as known in the art. In a preferred embodiment, the ion-exchange membrane is of the non-fluorinated type, for instance based on polybenzimidazole, polyetherketones or polysulfones, so that no fluorocarbon component is present in the obtained membrane-electrode assembly.

The membrane-electrode assembly obtained in accordance with the invention has superior performances when used in PEMFC, even with very low platinum loadings, but can also be useful for other types of fuel cells such as DMFC (direct methanol fuel cells) or for other electrochemical applications, such as membrane electrolysis processes.

BRIEF DESCRIPTION OF THE FIGURE

FIG. 1 shows the voltammetric curves of the electrode of the invention before and after applying a coat of Liquid Nafion suspension.

EXAMPLE

A gas diffusion medium was selected consisting of a three-dimensional woven carbon cloth coated with a mixture of Shawinigan Acetylene Black carbon particles and PTFE, for a total thickness of 410 microns, a basis weight of 210 g/m$^2$, a density of 0.54 g/cm$^3$, an electrical resistivity of 525 mΩcm, an air permeability of 0.84 Gurley and a porosity of 25 microns with a mean pore size of 6 microns. The gas diffusion layer had improved tensile properties and surface roughness perfectly suiting the subsequent superficial metal deposition. In particular, a standard smoothness test gave a value of 5000 Gurley seconds. The gas diffusion medium so obtained was subjected to dual IBAD deposition of platinum metal. The sample was first subjected to a first low-energy beam of 200 to 500 eV, to clean and partially texture the surface, then to platinum ions in a gaseous phase, extracted from a plasma and accelerated into a growing platinum coating on the gas diffusion layer surface at energies of 1000-2000 eV. Ion bombardment is the key factor controlling film properties in the IBAD process, imparting a substantial energy to the coating and the coating/substrate interface. This achieves the benefits of substrate heating (which generally provides a denser, more uniform film) without significantly heating the underlying gas-diffusion material which might degrade the bulk properties thereof. The ions also interact with coating atoms, driving them into the substrate and producing a graded material interface, which enhances adhesion. A total deposition of 0.04 mg/cm$^2$ was obtained, corresponding to an overall thickness of 25 nm.

Two small pieces were cut away form the sample, one of which was coated with 0.5 mg/cm$^2$ of Liquid Nafion as known in the art. Cyclic voltammetry was carried out on both the coated and the uncoated sample, with the results shown in FIG. 1, wherein (1) indicates the curve relative to the latter and (2) the one relative to the former. It is evident how, notwithstanding the teachings of the prior art, the available surface area appears to be decreased by the Nafion coating.

The remaining uncoated electrode was used to prepare a membrane-electrode assembly, upon bonding it via hot pressing procedure (for 10 minutes at 120° C. and 25 bar a) to a Nafion® 112 membrane in "sandwich-like" fashion. Contrary to the conventional MEA assemblies known in the art, no extra liquid ionomer was hence present in the manufactured MEA. In a subsequent fuel cell characterization, it was possible to generate 0.3 A/cm$^2$ at about 0.8 V and 0.7 A/cm$^2$ at about 0.7 V by feeding pure hydrogen and air at 1.5 bar a, at a stoichiometric ratio of 2 and with a cell temperature of 80° C.

The above description shall not be understood as limiting the invention, which may be practiced according to different embodiments without departing from the scopes thereof, and whose extent is solely defined by the appended claims.

In the description and claims of the present application, the word "comprise" and its variations such as "comprising" and "comprised" are not intended to exclude the presence of other elements or additional components.

What we claim is:

1. A gas diffusion electrode, substantially free of ionomeric components, comprising (i) in an electrically conductive web, (ii) a non-catalyzed gas diffusion layer comprising at least one electroconductive filler and at least one binder, and (iii) a noble metal coating obtained by subjecting the electrically conductive web to a first ion beam having an energy not higher that 500 eV, and then to a second beam having an energy of at least 500 eV, said second ion beam containing the ions of at least one noble metal.

2. The gas diffusion electrode of claim 1 wherein the electrically conductive web is a metal or carbon cloth or a carbon paper.

3. The gas diffusion electrode of claim 1 wherein said at least one electroconductive filler comprises carbon particles, optionally acetylene black carbon particles.

4. The gas diffusion electrode of claim 1 wherein said at least one binder is hydrophobic and optionally fluorinated.

5. The gas diffusion electrode of claim 1 wherein said gas diffusion layer has a smoothness of at least 1000 Gurley seconds.

6. A membrane-electrode assembly comprising at least one gas diffusion electrode of claim 1 and an ion-exchange membrane.

7. The membrane-electrode assembly of claim 6 wherein said at least one gas diffusion electrode and said ion-exchange membrane are mutually bonded by hot pressing.

8. The membrane-electrode assembly of claim 6 wherein said ion-exchange membrane is not fluorinated, and wherein no ionomeric fluorinated component is present.

* * * * *